United States Patent
Shiu et al.

(10) Patent No.: US 8,809,860 B2
(45) Date of Patent: *Aug. 19, 2014

(54) III-V COMPOUND SEMICONDUCTOR MATERIAL PASSIVATION WITH CRYSTALLINE INTERLAYER

(71) Applicant: International Business Machines Corporation, Armonk, NY (US)

(72) Inventors: Kuen-Ting Shiu, White Plains, NY (US); Dechao Guo, Fishkill, NY (US); Shu-Jen Han, Cortlandt Manor, NY (US); Edward W. Kiewra, Verbank, NY (US); Masaharu Kobayashi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/775,968

(22) Filed: Feb. 25, 2013

(65) Prior Publication Data

US 2013/0168834 A1 Jul. 4, 2013

Related U.S. Application Data

(62) Division of application No. 12/955,203, filed on Nov. 29, 2010, now Pat. No. 8,524,614.

(51) Int. Cl.
*H01L 29/04* (2006.01)
*H01L 29/10* (2006.01)

(52) U.S. Cl.
USPC ........ 257/51; 257/66; 257/347; 257/E29.255; 257/E21.193

(58) Field of Classification Search
USPC ............... 257/51, 66, E29.255, 347, E21.193
See application file for complete search history.

(56) References Cited

U.S. PATENT DOCUMENTS

| | | |
|---|---|---|
| 7,274,080 B1 | 9/2007 | Parkin |
| 2007/0161214 A1 | 7/2007 | Fompeyrine et al. |
| 2008/0001173 A1 | 1/2008 | Kiewra et al. |
| 2008/0001182 A1 * | 1/2008 | Chen et al. .................. 257/255 |
| 2009/0032863 A1 | 2/2009 | Levy et al. |
| 2010/0123205 A1 | 5/2010 | De Souza et al. |

OTHER PUBLICATIONS

Houssa, M., et al., "Surface Defects and Passivation of Ge and III-V Interfaces", MRS Bulletin, Jul. 2009, pp. 504-513, vol. 34, www.mrs.org/bulletin.

* cited by examiner

*Primary Examiner* — Robert Huber
(74) *Attorney, Agent, or Firm* — Scully, Scott, Murphy & Presser, P.C.; H. Daniel Schnurmann

(57) ABSTRACT

The present disclosure reduces and, in some instances, eliminates the density of interface states in III-V compound semiconductor materials by providing a thin crystalline interlayer onto an upper surface of a single crystal III-V compound semiconductor material layer to protect the crystallinity of the single crystal III-V compound semiconductor material layer's surface atoms prior to further processing of the structure.

9 Claims, 4 Drawing Sheets

III-V COMPOUND SEMICONDUCTOR MATERIAL PASSIVATION WITH CRYSTALLINE INTERLAYER

CROSS REFERENCE TO RELATED APPLICATION

This application is a divisional of U.S. patent application Ser. No. 12/955,203, filed Nov. 29, 2010 the entire content and disclosure of which is incorporated herein by reference.

BACKGROUND

The present disclosure relates to a semiconductor structure and a method of fabricating the same. More specifically, the present disclosure relates to a semiconductor structure including a III-V compound semiconductor material layer that includes a crystalline interlayer as a passivation layer for the III-V compound semiconductor material layer. The present disclosure also provides a method of forming such a semiconductor structure.

Compound semiconductors are semiconductor compounds composed of elements from two or more different groups of the Periodic Table of Elements. For example, III-V (or 13-15) compound semiconductors are composed of elements from Group 13 (B, Al, Ga, In) and from Group 15 (N, P, As, Si, Bi) of the Periodic Table of Elements. The range of possible formulae is quite broad because these elements can form binary alloys (i.e., alloys including two elements, e.g., GaAs), ternary alloys (i.e., alloys containing three elements, e.g., InGaAs) and quaternary alloys (i.e., alloys containing four elements, e.g., AlInGaP).

III-V compound semiconductors, as well as other classes of compound semiconductors, are receiving renewed attention for use as channel materials for advanced ultra large scale integration (ULSI) digital logic applications due to their high electron hole mobility relative to channel materials composed of silicon.

Despite having higher channel mobility than conventional silicon based devices, III-V compound semiconductors when used as the channel region of a metal oxide semiconductor field effect transistor (MOSFET) or other semiconductor devices suffer from a high density of interface states ($D_{it}$) which exists between the III-V compound semiconductor material layer and an overlying layer such as, for example, a high k dielectric material layer. A high density of interface states are typically caused when incoming adatoms (such as air, moisture, and/or a high k dielectric material) interact with the III-V compound semiconductor's surface atoms destroying the crystallinity of the III-V surface.

Efforts such as, for example, chemical pre-treatment or an amorphous Si passivation of the III-V compound semiconductor have been tried to reconcile this issue but with only limited successful; the density of interface states is still larger than $1E12/cm^2 ev$.

SUMMARY

The present disclosure reduces and, in some instances, eliminates the density of interface states in III-V compound semiconductor materials by providing a thin crystalline interlayer onto an upper surface of a single crystal III-V compound semiconductor material layer to protect the crystallinity of the single crystal III-V compound semiconductor material layer's surface atoms prior to further processing of the structure.

In one aspect of the present disclosure, a method is provided that includes forming a single crystal III-V compound semiconductor material layer on an upper surface of a III-V compound semiconductor substrate. A crystalline interlayer is then formed on an upper surface of the single crystal III-V compound semiconductor material layer. Next, a high k dielectric material layer is formed on an upper surface of the crystalline interlayer.

In another aspect of the present disclosure, a semiconductor structure is provided that includes a single crystal III-V compound semiconductor material layer located on an upper surface of a III-V compound semiconductor substrate. The structure further includes a crystalline interlayer located on an upper surface of the single crystal III-V compound semiconductor material layer. The structure even further includes a high k dielectric material layer located on an upper surface of the crystalline interlayer.

In some embodiments, the structure can further include a conductive material layer located on an upper surface of the high k dielectric material layer. In some instances, the conductive material layer and the underlying high k dielectric material layer can be employed as elements of a field effect transistor.

DETAILED DESCRIPTION

The present invention, which provides a semiconductor structure including a III-V compound semiconductor material layer that includes a crystalline interlayer as a passivation layer for the III-V compound semiconductor material layer and a method of fabricating the same, will now be described in greater detail by referring to the following discussion and drawings that accompany the present application. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
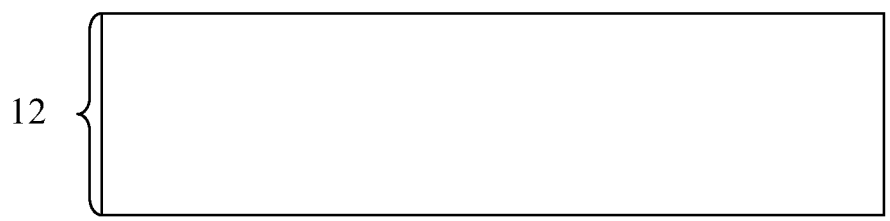
FIG. 1 is a pictorial representation (through a cross sectional view) illustrating an initial structure including a III-V compound semiconductor substrate that can be employed in one embodiment of the present disclosure.

Referring to FIG. 1, there is illustrated an initial structure 10 including a III-V compound semiconductor substrate 12 that can be employed in one embodiment of the present disclosure. The III-V compound semiconductor substrate 12 can be either a sole substrate of the initial structure 10 or a material layer that is formed atop another semiconductor substrate (not shown). When the III-V compound semiconductor substrate 12 is formed atop another substrate, the another substrate may comprise any semiconductor material including, but not limited to, Si, SiGe, SiGeC, SiC, Ge alloys, GaSb, GaP, GaAs, InAs, InP, Ge and all other III-V compound semiconductors.

The another substrate that may be located beneath the III-V compound semiconductor substrate 12 may comprise a layered semiconductor material such as, for example, a semiconductor-on-insulator. The another substrate and/or the III-V compound semiconductor substrate 12 may be doped, undoped or contain doped and undoped regions therein. The another semiconductor substrate or the III-V compound semiconductor substrate 12 may have a single crystal orientation or they may have surface regions that have different crystal orientations. The another substrate and/or the III-V compound semiconductor substrate 12 may be strained, unstrained or a combination thereof.

The III-V compound semiconductor substrate 12 comprises a single crystal semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present disclosure as the III-V compound semiconductor substrate 12 include, but are not limited to, alloys of GaAs, InAs, InP, InGaAs, InAlAs, InAlAsSb, InAlAsP and InGaAsP. In one embodiment, the III-V compound semiconductor substrate 12 is a binary compound semiconductor, with GaAs being highly preferred in some embodiments.

As stated above, the III-V compound semiconductor substrate 12 can be employed as the sole substrate, or as a material layer that is formed atop another substrate. Notwithstanding whether the III-V compound semiconductor substrate 12 is the sole substrate or a material layer formed atop another substrate, the III-V compound semiconductor substrate 12 employed is a single crystal material of typical 'commercial quality'. By "typical commercial quality" it is meant that the III-V compound semiconductor substrate 12 has a defect density on the order of about $10^5$ atoms/cm$^2$ or less, with a defect density of less than about 5000 atoms/cm$^2$ being more typical.

The III-V compound semiconductor substrate 12 can be purchased from well known vendors or it can be formed utilizing techniques that are well known in the art.

After providing the III-V compound semiconductor substrate 12 (either as a sole substrate or as a material layer located atop other substrate), the III-V compound semiconductor substrate 12 is typically, but not necessarily always, cleaned utilizing a conventional cleaning process such as, for example, 1) use of acetone to clean the substrate surface, 2) followed by iso-propanol alcohol (IPA), 3) followed up with de-ionized water (DI water), 4) followed up with 9:1 HF:H$_2$O clean and DI water clean, that removes contaminates and/or surface oxides from the surface of the III-V compound semiconductor substrate 12.

Figure 2:
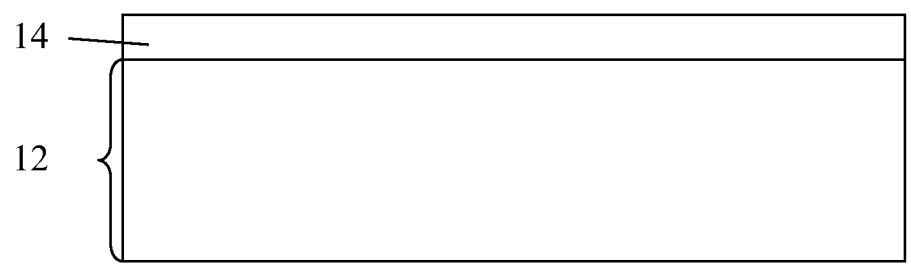
FIG. 2 is a pictorial representation (through a cross sectional view) illustrating the initial structure of FIG. 1 after forming a single crystal III-V compound semiconductor material layer on the III-V compound semiconductor substrate.

Referring to FIG. 2, there is illustrated the initial structure 10 of FIG. 1 after forming a single crystal III-V compound semiconductor material layer 14 on an upper surface of the III-V compound semiconductor substrate 12. The single crystal III-V compound semiconductor material layer 14 is of higher quality than the III-V compound semiconductor substrate 12. By "high-quality" it is meant that the single crystal III-V compound semiconductor material layer 14 has fewer defects than the underlying III-V compound semiconductor substrate 12. Typically, the single crystal III-V compound semiconductor material layer 14 has a defect density on the order of about $10^4$ atoms/cm$^2$ or less, with a defect density of less than about $10^2$ atoms/cm$^2$ being more typical.

The single crystal III-V compound semiconductor material layer 14 can comprise the same or different, typically the same, III-V compound semiconductor as the III-V compound semiconductor substrate 12. In one embodiment, the single crystal III-V compound semiconductor material layer 14 and the III-V compound semiconductor substrate 12 are both comprised of GaAs.

The single crystal III-V compound semiconductor material layer 14 can be formed utilizing an epitaxial growth process such as, for example, molecular beam epitaxy (MBE), metalorgano chemical vapor deposition (MOCVD) or migration enhanced epitaxy. Migration enhanced epitaxy is a specialized MBE epitaxial growth technique which allows growing epitaxial layers at a lower temperature than conventional MBE. In some embodiments, migration enhanced epitaxy is preferred for use in forming the single crystal III-V compound semiconductor material layer 14 since such a technique provides smoother epitaxial growth than MBE or MOCVD.

The single crystal III-V compound semiconductor material layer 14 can be epitaxially grown utilizing III/V-containing precursors that are well known to those skilled in the art. In some embodiments, a graded III-V compound semiconductor material layer 14 can be formed. The thickness of the single crystal III-V compound semiconductor material layer 14 can vary depending on the technique used in forming the same. Typically, the single crystal III-V compound semiconductor material layer 14 has a thickness from 2 nm to 2000 nm, with a thickness from 5 nm to 30 nm being more typical.

In some embodiments, the single crystal III-V compound semiconductor material layer 14 can be cleaned utilizing a conventional cleaning process such as, for example, the cleaning process described above for cleaning the III-V compound semiconductor substrate 12.

Figure 3:
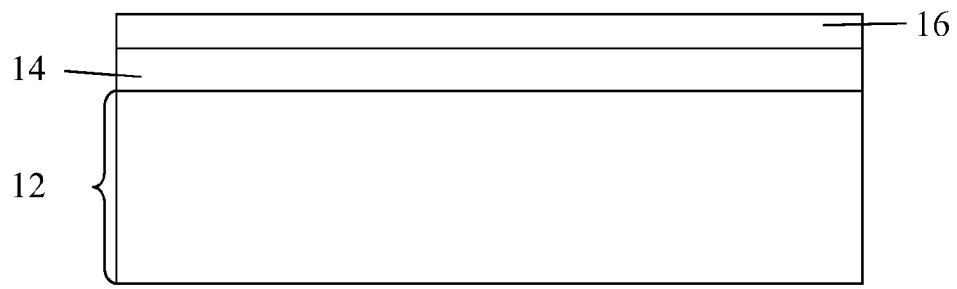
FIG. 3 is a pictorial representation (through a cross sectional view) illustrating the structure of FIG. 2 after forming a crystalline interlayer atop the single crystal III-V compound semiconductor material layer.

Referring to FIG. 3, there is illustrated the structure of FIG. 2 after forming a crystalline interlayer 16 directly atop the single crystal III-V compound semiconductor layer 14. The crystalline interlayer 16 that is formed directly on an upper surface of the single crystal III-V compound semiconductor material layer 14 can be formed utilizing a conventional epitaxy growth process such as, for example, MBE or MOCVD.

In one embodiment, the crystalline interlayer 16 that is formed is composed of a crystalline Al interlayer. In another embodiment, the crystalline interlayer 16 that is formed is composed of a crystalline In interlayer. In yet another embodiment, the crystalline interlayer 16 that is formed is composed of a crystalline Ga interlayer. In a further embodiment, the crystalline interlayer 16 that is formed is composed of a crystalline Si interlayer. In a yet even further embodiment, the crystalline interlayer 16 that is formed is composed of a crystalline SiGe interlayer.

The thickness of the crystalline interlayer 16 that is formed may vary depending on the technique used in forming the interlayer and the material of the interlayer itself. Typically, the crystalline interlayer 16 that is formed has a thickness from 0.5 monolayers to 3 monolayers, with a thickness from 1 monolayer to 2 monolayers being more typical.

Figure 4:
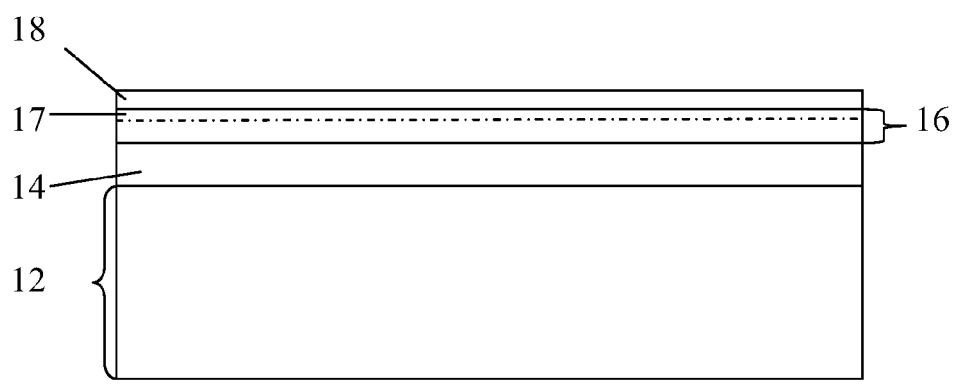
FIG. 4 is a pictorial representation (through a cross sectional view) illustrating the structure of FIG. 3 after forming a high k dielectric material layer atop the crystalline interlayer.

Referring now to FIG. 4, there is illustrated the structure of FIG. 3 after forming a high k dielectric material layer 18 atop the crystalline interlayer 16. The high k dielectric material layer 18 employed in the present disclosure has a dielectric constant of greater than silicon dioxide, i.e., 4.0. All dielectric constants mentioned herein are relative to a vacuum unless otherwise stated. Typically, the high k dielectric material layer 18 has a dielectric constant of about 7.0 or greater, with a dielectric constant of about 10.0 or greater being even more typical. Specifically, the high k dielectric material layer 18 employed in the present disclosure includes, but is not limited to, an oxide, nitride, oxynitride and/or silicate including metal silicates, aluminates, titanates and nitrides. A multilayered high k dielectric material layer 18 can also be employed in this disclosure. In one embodiment, the high k dielectric material layer 18 can be comprised of $HfO_2$, $ZrO_2$, $Al_2O_3$, $TiO_2$, $La_2O_3$, $SrTiO_3$, $LaAlO_3$, $Y_2O_3$, a pervoskite oxide, $HfSiO_z$ (i.e., hafnium silicon oxide), $HfAlO_z$ (i.e., hafnium aluminum oxide) or $HfAlO_aN_b$ (i.e., hafnium aluminum nitride). In some preferred embodiments, the high k dielectric material layer 18 can be comprised of Hf-based dielectric material.

In some embodiments, the high k dielectric material layer 18 can be formed utilizing an in-situ process. That is, the high k dielectric material layer 18 can be formed in the same reactor system as used in forming at least the crystalline interlayer 16 without breaking vacuum. While in other embodiments, the high k dielectric material layer 18 can be formed utilizing an ex-situ process. That is, the high k dielectric material layer 18 can be formed in a different reactor than forming at least the crystalline interlayer 16.

When the high k dielectric material layer 18 is formed in-situ, an upper surface of the crystalline interlayer 16 can be subjected to oxidation prior to forming the high k gate dielectric layer. In FIG. 4, reference numeral 17 denotes an oxide surface region that can be formed within an upper portion of the crystalline interlayer 16. In this embodiment, the oxide surface region 17 of the crystalline interlayer can be formed by treating the upper surface of the crystalline interlayer 16 with $H_2O/O_2/O_3$/2-propanol prior to formation of the high k dielectric material layer 18. In some embodiments, the oxidation can be omitted from the in-situ process. The high k dielectric material layer 18 can be formed utilizing one of the above mentioned deposition processes.

When the high k dielectric material layer 18 is formed ex-situ, a protective cap layer (not shown) such as an amorphous arsenic layer can be formed an upper surface of the crystalline interlayer 16 utilizing any conventional deposition process including, but not limited to, MBE and MOCVD. The term "amorphous" is used to denote that the protective cap layer lacks a well defined crystal structure. Following the formation of the protective cap layer, the structure can be removed from the reactor used in forming the crystalline interlayer 16 and it can be exposed to air. Next, the capped structure is placed in a reactor in which the high k dielectric material layer 18 is to be formed and then the protective cap layer is removed utilizing a conventional removal process such as, for example, thermal desorption. After removing the protective cap layer, the upper surface of the crystalline interlayer 16 can be subjected to the above described oxidation process that was used in the in-situ embodiment. In some embodiments, oxidation is omitted from the ex-situ process. The high k dielectric material layer 18 can then be formed utilizing one of the above mentioned deposition processes.

Notwithstanding whether the high k dielectric material layer 18 is formed by an in-situ process or ex-situ process, the high k dielectric material layer 18 can be formed utilizing a conventional deposition process including, but not limited to, molecular beam epitaxy (MBE), chemical vapor deposition (CVD), plasma enhanced chemical vapor deposition (PECVD), atomic layer deposition (ALD), evaporation, physical vapor deposition (PVD), chemical solution deposition and other like deposition processes.

The thickness of the high k dielectric material layer 18 may vary depending on the deposition technique employed in fabricating the same as well as the composition and number of dielectrics of the high k dielectric. Typically, the high k dielectric material layer 18 has a thickness from 0.5 to 20 nm, with a thickness from 1 to 10 nm being more typical.

It is noted that the presence of the crystalline interlayer 16 between the single crystal III-V compound semiconductor material layer 14 and the high k dielectric material layer 18 reduces and, in some instances, eliminates the density of interface states within the structure. For example, the presence of the crystalline interlayer 16 between the single crystal III-V compound semiconductor material layer 14 and the high k dielectric material layer 18 can provide a density of interface states of $10^{12}$ cm$^{-2}$ ev$^{-1}$ or less within the structure. In contrast thereto, and when no crystalline interlayer is present between the single crystal III-V compound semiconductor material layer and the high k dielectric material layer, the structure has a density of interface states of $10^{13}$ cm$^{-2}$ ev$^{-1}$ or greater. The density of interface density can be measured by capacitance-voltage characteristics.

In addition, the presence of the crystalline interlayer 16 between the single crystal III-V compound semiconductor material layer 14 and the high k dielectric material layer 18 aids in maintaining the crystallinity (both stoichiometry and flatness) of the single crystal III-V compound semiconductor material layer's 14 surface.

Figure 5:
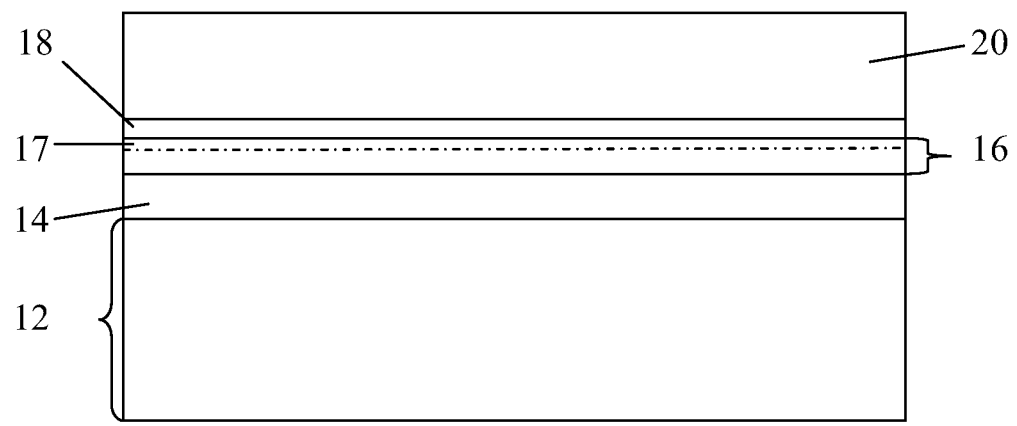
FIG. 5 is a pictorial representation (through a cross sectional view) illustrating the structure of FIG. 4 after forming a conductive material layer atop the high k dielectric material layer.

Referring to FIG. 5, there is illustrated the structure of FIG. 4 after forming a conductive material layer 20 atop the high k dielectric material layer 18. The conductive material layer 20 includes at least one conductive material such as, for example, polysilicon, silicon germanium, conductive metals, conductive metal alloys, conductive silicides, conductive nitrides and combinations or multilayers thereof. When metallic-containing conductive materials are employed, the metallic conductive material can be doped so as to shift the work function of the conductive material layer 20. Illustrative examples of dopant ions include As, P, B, Sib, Bi, Al, Gab, Tl or mixtures thereof. The same dopants are also used with polysilicon or SiGe mentioned above. In some embodiments, the conductive material layer 20 is a conductive metal, with Al, Pt, Au, W and Ti being preferred in some cases. The selection of metal conductive materials is advantageous in some instances since conductive metals have different work functions that permit one to adjust the threshold voltage of the device.

The conductive material layer 20 can be formed by a conventional deposition process such as, or example, CVD, PECVD, PVD, plating, thermal or ebeam evaporation and sputtering. The thickness of the conductive material layer 20 may vary depending on the material of the conductive material layer itself, as well as the processing technique used to form the same. Typically, the conductive material layer 20 has a thickness form 50 to 200 nm, with a thickness from 100 to 150 nm being even more typical.

In some embodiments (not shown) an optional hard mask can be formed atop the surface of the conductive material layer 20. The optional hard mask is not used in embodiments in which conductive material layer 20 is comprised of silicon or silicon germanium. If present, the optional hard mask can be comprised of an oxide, nitride or oxynitride, with oxides of silicon and/or nitrides of silicon being highly typical. The hard mask, if present, can be formed utilizing a conventional deposition process including, but not limited to, CVD, PECVD, ALD, and chemical solution deposition. Alternatively, the hard mask can be formed by a thermal oxidation and/or nitridation process.

The thickness of the optional hard mask, if present, may vary depending on the material of the hard mask, as well as the processing technique used to form the same. Typically, the optional hard mask has a thickness from 500 Å to 1000 Å, with a thickness from 100 Å to 500 Å being even more typical.

Figure 6:
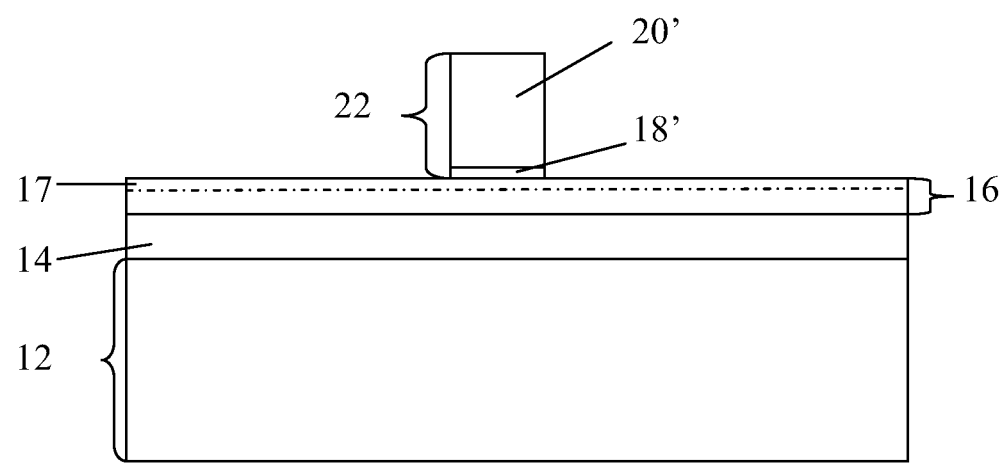
FIG. 6 is a pictorial representation (through a cross sectional view) illustrating the structure of FIG. 5 after forming a patterned material stack comprising at least a portion of the conductive material layer and a portion of the high k dielectric material layer.

Referring to FIG. 6, there is shown the structure of FIG. 5 after forming a patterned material stack 22 comprising at least a portion of the conductive material layer 20' and a portion of the high k dielectric material layer 18'. The patterned material stack 22 can be formed by lithography and etching. The lithographic step includes applying a photoresist (not shown) atop the optional hard mask, if present, or atop the conductor material layer 20, if the hard mask is not present, exposing the photoresist to a pattern of radiation and thereafter developing the exposed photoresist utilizing a conventional resist developer. The pattern within the developed photoresist is then transferred into the underlying material layers utilizing one or more etching steps, including dry etching and/or wet etching. When dry etching is used to transfer the pattern into the underlying layers, one of reactive ion etching, ion bean etching, plasma etching and laser ablation can be used. When wet etching is used, a chemical etchant that selectively removes at layers 20 and 18 can be employed. The transfer of the pattern may first be into the hard mask, followed by resist removal and continued etching into layers 20 and 18. The etching can stop atop the crystalline interlayer 16, e.g., atop the oxidized upper surface region 17, as shown, for example, in FIG. 6. The resist is removed during or after the pattern transfer process by a conventional resist removal step such as, for example, ashing.

Figure 7:
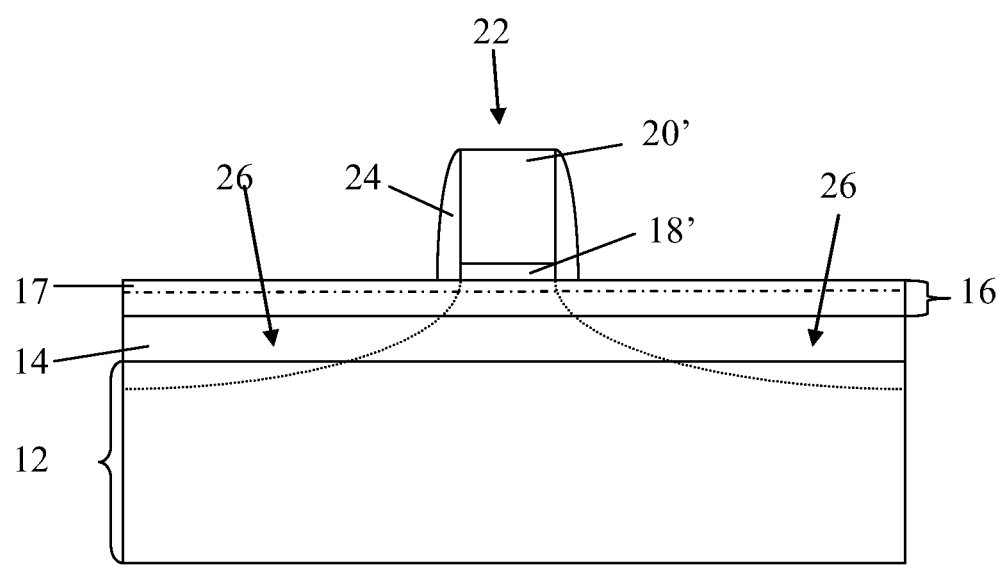
FIG. 7 is a pictorial representation (through a cross sectional view) illustrating the structure of FIG. 6 after forming spacers, and source/drain regions at the footprint of the patterned material stack.

Referring now to FIG. 7, there is illustrated the structure of FIG. 6 after forming at least one spacer 24, a source region, and a drain region (collectively referred to herein as source/drain regions 26) at the footprint of the patterned material stack 22. The order of spacer formation and source/drain regions 26 formation may vary. In one embodiment, the at least one spacer 24 is formed prior to forming the source/drain regions 26. In yet another embodiment, the at least one spacer 24 is formed after forming the source/drain regions 26. In some embodiment, source/drain extension regions (not shown) are formed, then at least one spacer 24 is formed and thereafter the source/drain regions 26 are formed. In yet another embodiment, a first spacer is formed, then source/drain extension regions are formed, then a second spacer is formed that has a width that is wider than the first spacer, and then the source/drain regions are formed.

Notwithstanding the order of formation of the at least one spacer and the source/drain regions, the at least one spacer 24 is typically formed directly on an exposed sidewall of the patterned material stack 22. The at least one spacer 24 can be formed utilizing a conventional deposition process, followed by etching. The at least one spacer 24 may be comprised of an oxide, a nitride and/or an oxynitride. Typically, oxides of silicon and/or nitrides of silicon are used as spacer materials.

The source/drain regions 26 can be formed through portions of the crystalline interlayer 16 and portions of the single crystal III-V compound semiconductor material layer 14 and into an upper portion of III-V compound semiconductor substrate 12 that are not located beneath the at least patterned material stack 22. The source/drain regions 26 are formed by conventional ion implantation, followed by a thermal activation step. The thermal activation step is performed at a temperature of about 550° C. or higher, with an activation temperature of about 600° C. or higher being even more typical. It is noted that portions of the III-V compound semiconductor material layer 14 that are located beneath the patterned material stack 22 and positioned between the source/drain regions 26 is the channel region of the device.

In some embodiments not shown, the portions of oxide surface region 17, if present, and layers 16 and 14 not including the at least one spacer 24 and the patterned material stack 22 can be removed utilizing one or more etching steps. In one embodiment, hydrogen fluoride can be used as a chemical etchant that selectively removes the unprotected portions of oxide surface region 17 and layers 16 and 14. It is observed that this step is optional and need not performed in all instances. In some embodiments, only the exposed portions of the oxide surface region 17 are removed utilizing a chemical etchant that selectively removes the oxide surface region 17 relative to the non-oxidized portions of the crystalline interlayer 16.

Further devices processing steps such as, for example, semiconductor metal alloy contact formation, and interconnect formation can be performed utilizing conventional techniques well known to those skilled in the art.

It is noted that the basic processing steps shown in at least FIGS. 1-4 can be used in for fabricating other types of semiconductor devices in which III-V semiconductor compounds can be used. As such, the method illustrated in FIG. 1-4 is not limited to forming transistors as depicted in the remaining drawings, i.e., FIGS. 5-7, of the present disclosure.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
   a single crystal III-V compound semiconductor material layer located on an upper surface of a III-V compound semiconductor substrate;

a crystalline interlayer located on an upper surface of the single crystal III-V compound semiconductor material layer, wherein said crystalline interlayer is selected from the group consisting of a layer of Al, a layer of In, and a layer of Ga; and a high k dielectric material layer located on an upper surface of the crystalline interlayer.

2. The semiconductor structure of claim 1 wherein an oxide surface region is located within an upper surface of said crystalline interlayer.

3. The semiconductor structure of claim 1 wherein said single crystal III-V compound semiconductor material layer and said III-V compound semiconductor substrate are composed of a same or different III-V compound semiconductor.

4. The semiconductor structure of claim 3 wherein said III-V compound semiconductor includes alloys of GaAs, InAs, InP, InGaAs, InAlAs, InAlAsSb, InAlAsP or InGaAsP.

5. The semiconductor structure of claim 1 wherein said high k dielectric material layer comprises an oxide, nitride, oxynitride, silicate or multilayer thereof.

6. The semiconductor structure of claim 5 wherein said high k dielectric material layer comprises $HfO_2$, $ZrO_2$, $Al_2O_3$, $TiO_2$, $La_2O_3$, $SrTiO_3$, $LaAlO_3$, $Y_2O_3$, a pervoskite oxide, hafnium silicon oxide, hafnium aluminum oxide or hafnium aluminum nitride.

7. The semiconductor structure of claim 1 further comprising a conductive material layer located on an upper surface of said high k dielectric material layer.

8. The semiconductor structure of claim 7 wherein said conductive material layer and said high k dielectric material layers are components of a field effect transistor.

9. The semiconductor structure of claim 8 wherein said field effect transistor further includes a source region and a drain region located within portions of at least said III-V compound semiconductor material layer and said III-V compound semiconductor substrate that are not protected by a patterned material stack of said conductive material layer and said high k dielectric material layer.

* * * * *